US006597198B2

(12) United States Patent
Haycock et al.

(10) Patent No.: US 6,597,198 B2
(45) Date of Patent: Jul. 22, 2003

(54) CURRENT MODE BIDIRECTIONAL PORT WITH DATA CHANNEL USED FOR SYNCHRONIZATION

(75) Inventors: Matthew B. Haycock, Beaverton, OR (US); Stephen R. Mooney, Beaverton, OR (US); Aaron K. Martin, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/972,327

(22) Filed: Oct. 5, 2001

(65) Prior Publication Data

US 2003/0067325 A1 Apr. 10, 2003

(51) Int. Cl.[7] .......................................... H03K 19/0175
(52) U.S. Cl. .............................. 326/82; 326/86; 326/90; 326/93
(58) Field of Search ............................ 326/30, 82, 83, 326/86, 90, 93

(56) References Cited

U.S. PATENT DOCUMENTS

| | | | |
|---|---|---|---|
| 4,573,168 A | 2/1986 | Henze et al. | 375/36 |
| 4,624,006 A | 11/1986 | Rempfer et al. | 377/69 |
| 4,967,140 A | 10/1990 | Groeneveld et al. | 323/315 |
| 5,218,239 A | 6/1993 | Boomer | 307/443 |
| 5,253,249 A | 10/1993 | Fitzgerald et al. | 370/24 |
| 5,457,406 A | 10/1995 | Takada et al. | 326/30 |
| 5,481,207 A | 1/1996 | Crafts | 326/86 |
| 5,490,171 A | 2/1996 | Epley et al. | 375/257 |
| 5,530,377 A | 6/1996 | Walls | 326/30 |
| 5,604,450 A | 2/1997 | Borkar et al. | 326/82 |
| 5,675,811 A | 10/1997 | Broedner et al. | 395/750 |
| 5,778,204 A | 7/1998 | Van Brunt et al. | 395/308 |
| 5,787,298 A | 7/1998 | Broedner et al. | 395/750.05 |
| 5,793,248 A | 8/1998 | Lee et al. | 327/543 |
| 5,841,827 A | 11/1998 | Chevallier | 377/20 |
| 5,874,837 A * | 2/1999 | Manohar et al. | 326/83 |
| 5,977,796 A * | 11/1999 | Gabara | 626/86 |
| 6,037,811 A | 3/2000 | Ozguc | 327/108 |
| 6,087,847 A | 7/2000 | Mooney et al. | 326/30 |
| 6,107,856 A | 8/2000 | Bitting | 327/307 |
| 6,133,749 A | 10/2000 | Hansen et al. | 326/30 |
| 6,188,237 B1 | 2/2001 | Suzuki et al. | 326/30 |
| 6,226,331 B1 | 5/2001 | Gambuzza | 375/258 |
| 6,256,234 B1 | 7/2001 | Keeth et al. | 365/189.05 |
| 6,329,843 B1 * | 12/2001 | Hirata et al. | 326/82 |

OTHER PUBLICATIONS

Haycock, M., et al., "A 2.5Gb/s Bidirectional Signaling Technology", *Hot Interconnects Symposium V*, pp. 1–8, (Aug. 1997).

* cited by examiner

Primary Examiner—Michael Tokar
Assistant Examiner—Anh Tran
(74) Attorney, Agent, or Firm—Schwegman, Lundberg, Woessner & Kluth, P.A.

(57) ABSTRACT

A simultaneous bidirectional port coupled to a bus combines a synchronization circuit and a data transceiver circuit. The combination data and synchronization transceiver circuit synchronizes the port with another simultaneous bidirectional port coupled to the same bus. The combination data and synchronization transceiver circuit includes a driver with a variable output current and a variable output resistance. Prior to synchronization, the driver has a low output current and low output resistance. When the simultaneous bidirectional port is ready to communicate, the variable output resistance is increased. When both simultaneous bidirectional ports are ready, the variable output resistance is set to properly terminate the line, and the variable output current is set to provide a desired voltage swing.

27 Claims, 8 Drawing Sheets

CURRENT MODE BIDIRECTIONAL PORT WITH DATA CHANNEL USED FOR SYNCHRONIZATION

FIELD

The present invention relates generally to digital data ports, and more specifically to bidirectional digital data ports.

BACKGROUND OF THE INVENTION

Integrated circuits typically communicate with other integrated circuits on wires that are part of a "bus." A typical bus includes many wires, or circuit board traces, connecting multiple integrated circuits. Some buses are "unidirectional," because signals only travel in one direction on each wire of the bus. Other buses are "bidirectional," because signals travel in more than one direction on each wire of the bus. In the past, most bidirectional buses were not "simultaneously bidirectional," because multiple signals did not travel on the same wire in opposite directions at the same time; instead, the bus was shared over time, and different signals traveled in different directions at different points in time. Some newer buses are "simultaneous bidirectional" buses. Simultaneous bidirectional buses allow data to travel in two directions on a single wire at the same time.

Before reliable communications can take place on a bus, the integrated circuits need to be ready to communicate, or be "synchronized," and each circuit on the bus should have information regarding the readiness of other circuits on the bus. Some circuits may need to be initialized, while others may need to become stabilized. In some bus applications, it can take an indeterminate amount of time for circuits to become ready to reliably communicate. It can be important to not drive data onto a bus until the intended receiver is ready to receive the data, especially in simultaneous bidirectional bus applications, where data is being driven in both directions at once.

For the reasons stated above, and for other reasons stated below which will become apparent to those skilled in the art upon reading and understanding the present specification, there is a need in the art for a method and apparatus to provide a synchronization mechanism for simultaneous bidirectional data buses.

DESCRIPTION OF EMBODIMENTS

In the following detailed description of the embodiments, reference is made to the accompanying drawings that show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

The method and apparatus of the present invention provide a mechanism to synchronize multiple simultaneous bidirectional ports on the same bus. A combination data and synchronization transceiver that includes a current mode transceiver is coupled to another similar circuit on a bidirectional bus. The current mode transceiver includes a variable current source and a variable termination resistor. Prior to synchronization, the variable current source is set to source a small current, and the termination resistance is switched from a low resistance value to a high resistance value to indicate that the integrated circuit is ready to communicate. During this time, the combination data and synchronization transceiver is used as a synchronization transceiver. After synchronization, the variable current source is set to source a larger current, the termination resistance is set to properly terminate the bidirectional bus line, and the data and synchronization transceiver is used as a data transceiver.

The combination data and synchronization transceiver also includes a synchronization receiver that has an input node coupled to the output of the combination data and synchronization transceiver. The synchronization receiver operates with a threshold that is satisfied only when drivers from both simultaneous bidirectional ports switch the respective termination resistance to a high resistance value, thereby alerting both ports that each is ready to communicate.

Figure 1:
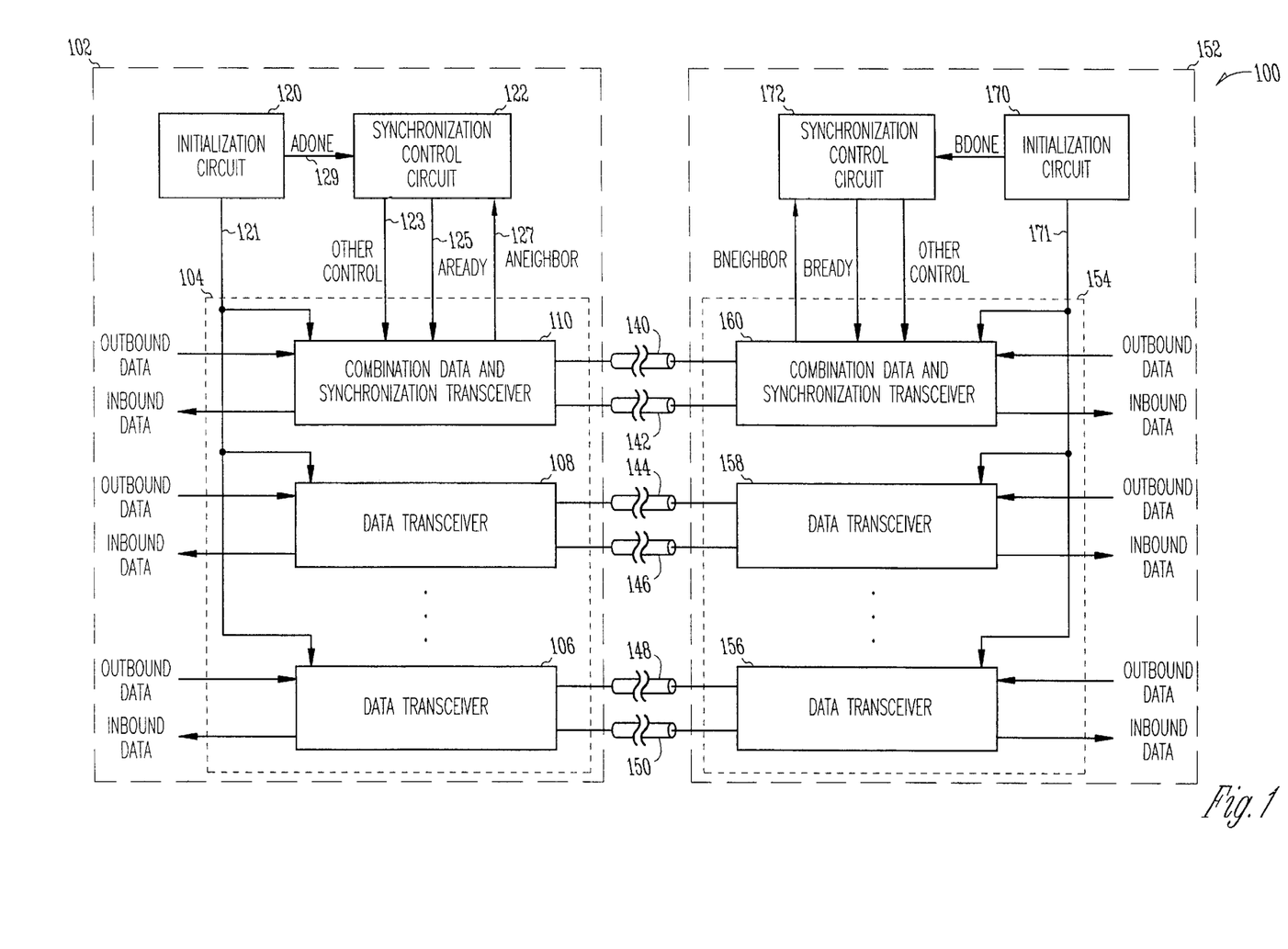
FIG. 1 shows a system employing simultaneous bidirectional ports.

FIG. 1 shows a system employing simultaneous bidirectional ports. System 100 includes integrated circuits 102 and 152. Integrated circuits 102 and 152 are coupled by a simultaneous bidirectional bus that includes conductors 140, 142, 144, 146, 148, and 150. For the purposes of explanation, integrated circuit 102 is considered to be the "A" agent on the simultaneous bidirectional bus, and integrated circuit 152 is considered to be the "B" agent on the same simultaneous bidirectional bus. Signals pertaining to circuits within integrated circuit 102 are prefixed with the letter "A," and signals pertaining to circuits within integrated circuit 152 are prefixed with the letter "B."

Integrated circuit 102 includes simultaneous bidirectional port 104, initialization circuit 120, and synchronization control circuit 122. Simultaneous bidirectional port 104 includes data transceivers 106 and 108, and combination data and synchronization transceiver 110. For simplicity, FIG. 1 shows one bidirectional port within each integrated circuit. Each integrated circuit on the simultaneous bidirectional bus can include any number of bidirectional ports, and bidirectional ports can include any number of transceivers. To simplify the explanation, each of integrated circuits 102 and 152 are shown with a single bidirectional port, and each bidirectional port is shown with two data transceivers and one combination data and synchronization transceiver.

Integrated circuit 152 includes initialization circuit 170, synchronization control circuit 172, and simultaneous bidirectional port 154. Simultaneous bidirectional port 154 includes data transceivers 156 and 158, and combination data and synchronization transceiver 160.

Transceivers 106, 108, 110, 156, 158, and 160 are current mode transceivers. Each transceiver switches current from one conductor to another based on whether the transceiver is transmitting a logical "1" or a logical "0." For example, data transceiver 106 is coupled to conductors 148 and 150, and switches output current between the two conductors based on the logical value being transmitted. Likewise, data transceiver 156 also switches output current between conductors 148 and 150. Each of data transceivers 106 and 156 simultaneously transmit and receive data using conductors 148 and 150. Current mode data transceivers are described in greater detail with reference to later figures.

In operation, prior to synchronization, synchronization control circuits 122 and 172 control the respective combination data and synchronization transceivers and cause them to enter "synchronization mode," and function as synchronization circuits. During this time, initialization circuits 120 and 170 initialize various circuits within integrated circuits 102 and 104. For example, receiver offsets can be adjusted, termination resistors can be set, and current sources can be initialized. In general, any operation can be performed prior to synchronization. When in synchronization mode, data and synchronization transceivers 110 and 160 do not switch currents between conductors 140 and 142. Instead, one of conductors 140 and 142 is used to provide a single conductor for the purposes of synchronization.

The synchronization process begins with synchronization control circuit 122 asserting control signals on node 123 to cause combination data and synchronization transceiver 110 to enter synchronization mode. The operation of combination data and synchronization transceivers is described in more detail below with reference to later figures. While combination data and synchronization transceiver 110 is in synchronization mode, initialization circuit 120 initializes portions of integrated circuit 102. In some embodiments, the operation of initialization circuit 120 includes initializing portions of data transceivers 106 and 108. During this time, synchronization control circuit 122 maintains significant control over the operation combination data and synchronization transceiver 110.

When initialization circuit 120 has completed the appropriate initialization functions, it asserts the ADONE signal on node 129 to synchronization control circuit 122. Synchronization control circuit 122 then asserts the AREADY signal on node 125 to signify that integrated circuit 102 is ready to communicate. Synchronization control circuit 122 then monitors the ANEIGHBOR signal on node 127. When the ANEIGHBOR signal is asserted, both A and B agents on the simultaneous bidirectional bus are ready to conmmunicate, and the bus is synchronized. At this time, synchronization control circuit 122 asserts control signals on node 123 to cause combination data and synchronization transceiver 110 to enter "data transceiver mode," and function as a data transceiver.

In some embodiments, other initialization functions are performed prior to asserting the AREADY signal. In these embodiments, synchronization control circuit 122 receives multiple DONE signals, one from each initialization. For example, in some embodiments, a processor (not shown) within integrated circuit 102 undergoes an initialization process, and when initialized, a DONE signal is asserted by the processor to synchronization control circuit 122. In general, synchronization control circuit 122 can be responsive to any number of DONE signals. In some embodiments, synchronization control circuits and initialization circuits are combined into one initialization circuit. In other embodiments, initialization circuits include additional useful initialization functions.

The initialization process just described can be performed at system startup, or after an event that cause a re-initialization. For example, when system power is applied, synchronization control circuits 122 and 172 provide start-up initialization. Also for example, when a portion of system 100 is reset or is subject to a large noise event, re-initialization may take place. Initialization can also take place during a hot-swap event, when one or more system components are removed or added to the system while power is applied.

Integrated circuits 102 and 152 utilize a single external conductor (either conductor 140 or 142 in FIG. 1), for two purposes. Prior to communication taking place on the bus, the conductor is used for synchronization purposes. After synchronization, the conductor is used for simultaneous bidirectional data transmission. By utilizing a single external conductor for both data transmission and synchronization purposes, the need for a dedicated signal line for synchronization purposes is obviated. This reduces the external pin count on integrated circuits 102 and 152, which reduces the packaging cost of the integrated circuits.

In some embodiments, combination data and synchronization transceivers 110 and 160 are associated with a least significant bit on the simultaneous bidirectional port. In other embodiments, combination data and synchronization transceivers 110 and 160 are associated with a most significant bit on the simultaneous bidirectional port. In general, combination data and synchronization transceivers can be used for any bit on the bus without departing from the scope of the present invention. Further, simultaneous bidirectional ports 104 and 154 are each shown with one combination data and synchronization transceiver. In some embodiments, simultaneous bidirectional ports 104 and 154 each include multiple combination data and synchronization transceivers.

In embodiments represented by FIG. 1, integrated circuits 102 and 152 are shown having substantially similar circuits. In other embodiments, integrated circuits 102 and 152 do not have substantially similar circuits. For example, integrated circuits 102 and 152 can be processors, processor peripherals, memory devices including dynamic random access memories (DRAM), memory controllers, or any other integrated circuit employing simultaneous bidirectional ports.

In some embodiments, synchronization control circuits and initialization circuits are one or more processors that perform the indicated functions in software. For example, in some application specific integrated circuit (ASIC) embodiments, a microprocessor core exists in place of synchronization control circuit 122 and initialization circuit 120.

Figure 2:
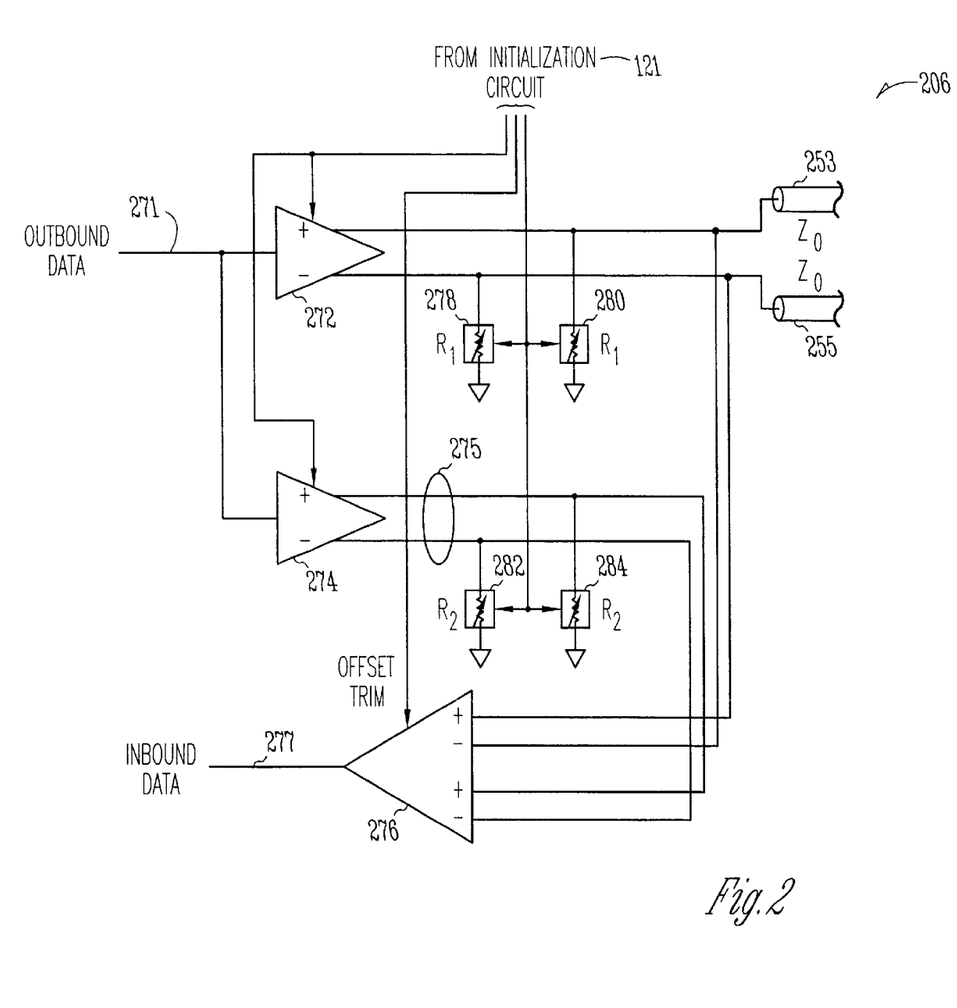
FIG. 2 shows a current mode data transceiver.

FIG. 2 shows a current mode data transceiver. Transceiver 206 is a current mode transceiver suitable for use as a data transceiver in a simultaneous bidirectional port, such as data transceivers 106, 108, 156, and 158 (FIG. 1). Transceiver 206 includes current mode output driver 272, current mode return driver 274, differential receiver 276, and termination resistors 278, 280, 282, and 284. Outbound data on node 271 is data generated within the integrated circuit that is to be transmitted through conductors 253 and 255 to be received by a similar data transceiver within another integrated circuit. Current mode driver 272 accepts the outbound data on node 271 and drives nodes coupled to conductors 253 and 255. The outputs of current mode output driver 272 also feedback to drive a differential input node of differential receiver 276. Current mode return driver 274 drives a second differential input node of differential receiver 276.

Current mode output driver 272 switches current between conductors 253 and 255 as a function of the logical state of data on node 271. Likewise, current mode return driver 274 switches current between differential data lines 275 as a function of the logical state of data on node 271.

As previously described, differential receiver 276 has two sets of differential input nodes, one coupled to conductors 253 and 255, and the other coupled to differential data lines 275. Conductors 253 and 255 include data driven by both driver 272 and a similar driver (not shown) on the other end of conductors 253 and 255. In contrast, data lines 275 only include data driven by driver 274. Differential receiver 276 subtracts the differential voltage on conductors 253 and 255 from a differential voltage on differential data lines 275 to produce inbound data on node 277. Inbound data on node 277 represents the outbound data sent from the similar driver (not shown) on the other end of conductors 253 and 255 across the simultaneous bidirectional interface. For example, when data transceiver 206 is used to implement data transceiver 106 (FIG. 1), the inbound data on node 277 corresponds to data transmitted by data transceiver 156 (FIG. 1).

As previously described, drivers 272 and 274 are current mode drivers that switch currents between output nodes as a function of the logical state of the input node. Current mode output driver 272 drives a differential current on conductors 253 and 255. This differential current is terminated by the resistance ($R_1$) of resistors 278 and 280. Therefore, current mode output driver 272 is terminated with an impedance equal to $R_1$. In contrast, current mode return driver 274 drives differential data lines 275 which are terminated by resistors 282 and 284 having a resistance value of $R_2$.

In embodiments represented by FIG. 2, initialization circuit 120 (FIG. 1) scan initialize multiple aspects of the transceivers. For example, initialization circuit 120 can initialize the resistance values of resistors 278, 280, 282, and 284, the drive currents of drivers 272 and 274, and the offset trim of differential amplifier 276. In some embodiments, the resistance values are set first to match the characteristic impedance of the conductors 253 and 255. Then, the current drive of current mode drivers 272 and 274 are set to achieve a desired voltage swing on conductors 253 and 255 and differential data lines 275. Once these values are set, initialization circuit 120 asserts ADONE, and the synchronization sequence continues as described above.

Figure 3:
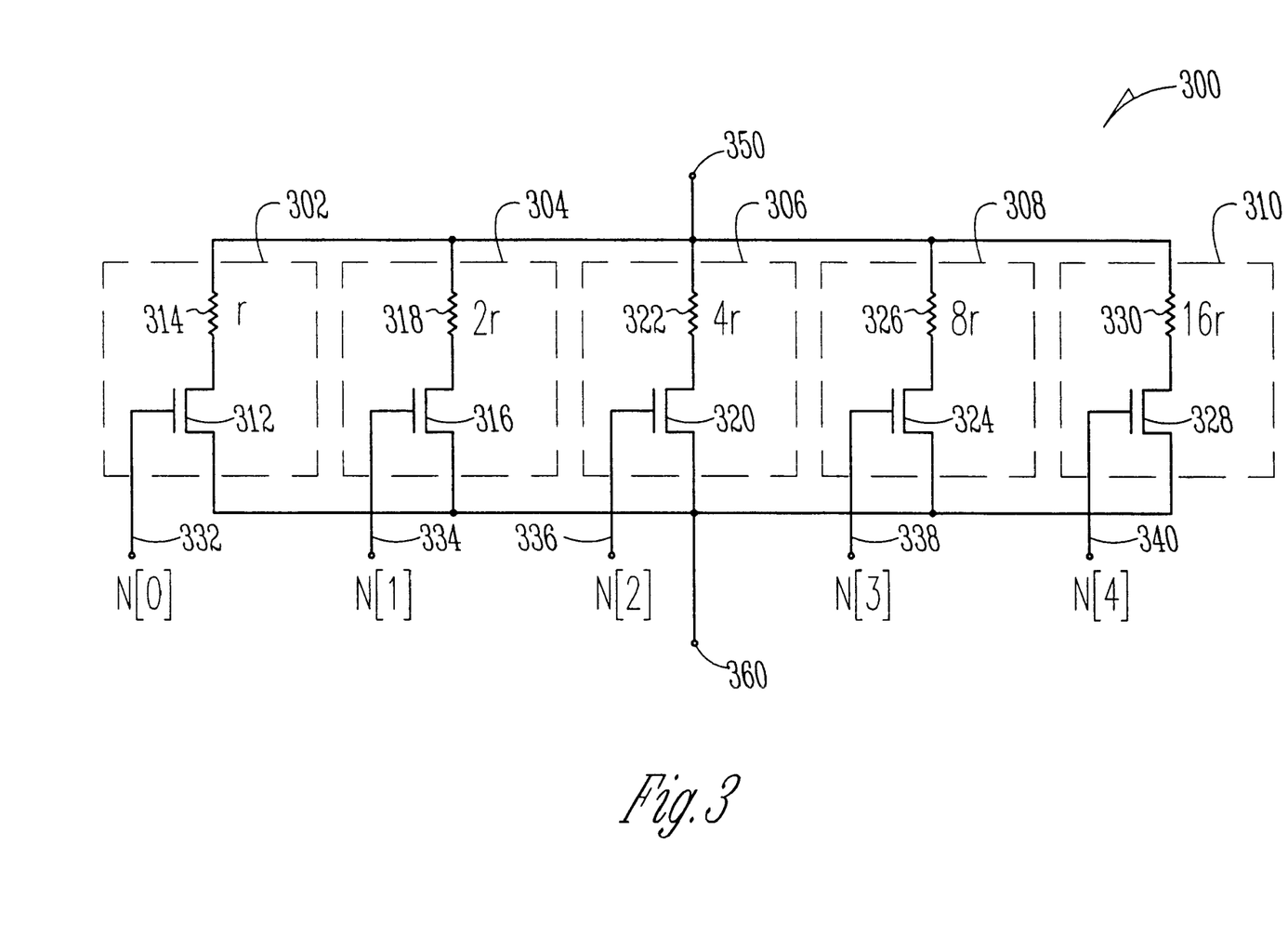
FIG. 3 shows a variable resistor.

FIG. 3 shows a variable resistor suitable for use as variable resistors 278 280, 282, and 284 (FIG. 2). Variable resistor 300 includes multiple resistive devices, each having a control input node. For example, variable resistor 300 includes resistive devices 302, 304, 306, 308, and 310. Each of the resistive devices includes a transistor and a fixed value resistor. For example, resistive device 302 includes NFET 312 and resistor 314. Likewise, resistive devices 304, 306, 308, and 310 include NFETs 316, 320, 324, and 328 and resistors 318, 322, 326, and 330, respectively.

In embodiments represented by FIG. 3, transistors 312, 316, 320, 324, and 328 are n-channel metal oxide semiconductor field effect transistors (NMOSFETs), also referred to as "NFETs." Other types of transistors can also be used. For example, embodiments exist that utilize bipolar junction transistors (BJTs) and junction field effect transistors (JFETs). One of ordinary skill in the art will understand that many other types of transistors can be utilized without departing from the scope of the present invention.

Each resistive device is coupled in parallel between two reference nodes 350 and 360. Each resistive device includes a control input node having a signal that either turns on or turns off the NFET. For example, NFET 312 within resistive device 302 has a gate driven with the signal on control node 332. Likewise, control nodes 334, 336, 338, and 340 provide control signals to NFETs 316, 320, 324, and 328, respectively.

The resistors within the resistive devices can be any type of resistor fabricated on an integrated circuit. In some embodiments, resistors are fabricated as n-well resistors, as is known in the art. In the embodiment shown in FIG. 3, the resistive devices have binary weighted resistance values. For example, resistor 314 has a resistance value of "r," and resistor 318 has a resistance value of "2r." The resistance values double for each resistive device, and the largest resistance value of "16r" exists in resistive device 310.

Control input nodes 332, 334, 336, 338, and 340, taken together, form a control bus. In the embodiment of FIG. 3, this control bus is driven by a five bit wide signal labeled N[4:0]. This control bus corresponds to a portion of the output of initialization circuit 120 (FIG. 1). By varying which control signals are asserted, 31 different resistance values can be obtained between nodes 350 and 360.

Variable resistor 300 has been described with resistive devices, each including a resistor with a binary weighting relative to the other resistors. Any number of resistive devices can be included without departing from the scope of the present invention. Binary weighting can be maintained with a large number of resistive devices, or a linear weighting can be employed. For example, variable resistor 300 can be implemented with each resistive device including a resistor of equal value. This reduces the number of possible resistance values available, but also reduces the possibility of a transient resistance value appearing when signal values on the input bus change.

Figure 4:
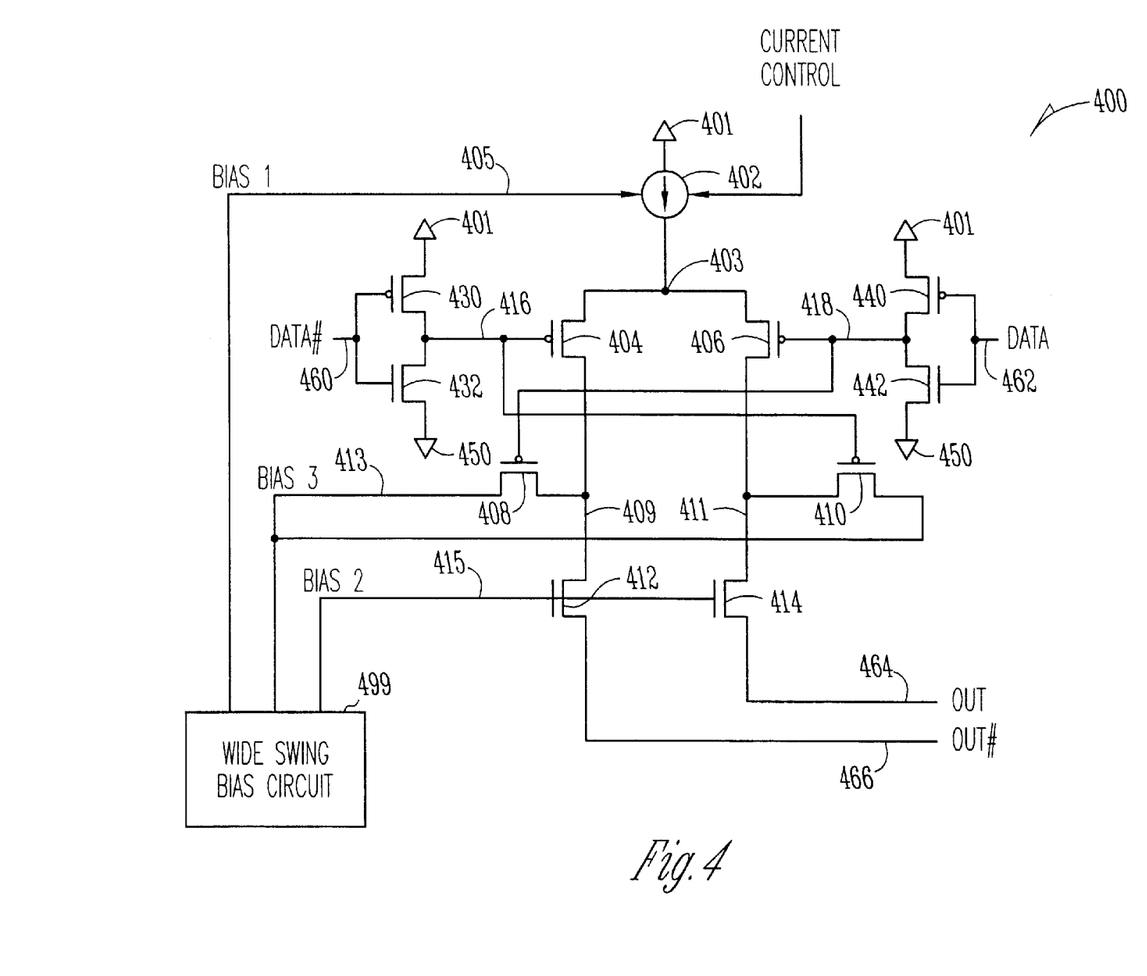
FIG. 4 shows a current mode driver having a variable current drive.

FIG. 4 shows a current mode driver having a variable current drive, suitable for use as current mode driver 272 (FIG. 2). Current driver 400 has a pair of differential input nodes 460 and 462, and a pair of differential output nodes 464 and 466. In operation, a digital signal and its logical complement, "DATA" and "DATA#," are provided on differential input nodes 462 and 460, respectively. These signals correspond to the OUTBOUND DATA signal shown in FIG. 2. In response to the digital input signal, a current appears on one of the two differential output nodes 464 and 466. For example, when the DATA signal is high, and the DATA# signal is low, a current signal "OUT" appears on node 464, and no current appears on node 466. When the input signals on differential input nodes 460 and 462 are in the opposite state, no current appears on node 464, and a current signal "OUT#" appears on node 466.

Current mode driver 400 includes variable current source 402, and transistors 404, 406, 408, 410, 412, and 414. Variable current source 402 sources a variable amount of current from power supply node 401 to internal node 403. The amount of current sourced by variable current source 402 is determined in part by a bias voltage on node 405, shown as "BIAS 1" in FIG. 4, and is also determined in part by the state of control signals received from the initialization circuit, shown as "CURRENT CONTROL" in FIG. 4.

All of the transistors shown in FIG. 4, with the exception of transistors 432, 442, 412, and 414 are p-type metal oxide semiconductor field effect transistors (PMOSFETs), also referred to as PMOS transistors. The method and apparatus of the present invention is not limited to the use of PMOS transistors. For example, in some embodiments, n-type (NMOS) transistors are employed, and in others, bipolar junction transistors (BJT) are employed. One skilled in the art will appreciate that a multitude of embodiments exist, each having different types of transistors and combinations of types of transistors. All of these embodiments are within the scope of the present invention.

Transistors 404 and 406 form a differential input pair driven by differential data signals on nodes 416 and 418. In operation, the differential data signals on nodes 416 and 418 are generated by complementary metal oxide semiconductor (CMOS) drivers created from transistors 430, 432, 440, and 442. The differential data signals on nodes 416 and 418 transition substantially between power supply voltages on nodes 401 and 450. This is also referred to as "swinging rail to rail."

As nodes 416 and 418 transition in voltage, transistors 404 and 406 alternately transition between an "off" state and an "on" state. When the transistors are off, they do not conduct current from source to drain, and when on, they do conduct current from source to drain. The current sourced by variable current source 402 is, therefore, switched between the two paths provided by the differential input pair as a function of the input data signal.

Transistor 404 has a gate coupled to node 416, a source coupled to internal node 403, and a drain coupled to cascode node 409. Likewise, transistor 406 has a gate coupled to node 418, a source coupled to internal node 403, and a drain coupled to cascode node 411. As discussed above, because of the switching action of the input differential pair, only one of cascode nodes 409 and 411 has a steady-state current flowing thereon at a time. For example, when the voltage on node 416 is high and the voltage on node 418 is low, the current from variable current source 402 flows through input transistor 406 and on node 411, and input transistor 404 is off and no current flows on node 409. Also for example, when the voltage on node 416 is low and the voltage on node 418 is high, the current from variable current source 402 flows through input transistor 404 and on node 409, and input transistor 406 is off and no current flows on node 411.

Current mode driver 400 also includes pre-charge transistors 408 and 410. Pre-charge transistors 408 and 410 charge cascode nodes 409 and 411, respectively, when no current flows on the respective cascode node. For example, when input transistor 404 is off and no current flows on node 409, pre-charge transistor 408 is on and cascode node 409 charges to a voltage value of "BIAS3" provided on node 413 by wide-swing bias circuit 499. Also for example, when input transistor 406 is off, pre-charge transistor 410 is on and cascode node 411 is charged to "BIAS3." Precharge transistors 408 and 410 are examples of pre-charge circuits that pre-charge the cascode nodes when no current flows thereon. In some embodiments, other precharge circuits are used to charge the cascode nodes.

Current mode driver 400 also includes cascode output transistors 412 and 414. Cascode output transistor 412 is coupled from source to drain between cascode node 409 and output node 466. Likewise, cascode transistor 414 is coupled from source to drain between cascode node 411 and output node 464. Cascode output transistors 412 and 414 are biased in saturation by a bias voltage "BIAS2" provided on node 415 by wide-swing bias circuit 499.

The effective output capacitance of current driver 400 is small in part because cascode output transistors 412 and 414 operate in saturation, which provides a high impedance path to all of the parasitic capacitances at the internal nodes of current driver 400. Current driver 400 also has a high output impedance achieved by the cascode connections.

Because input transistors 404 and 406 have rail to rail input swings, they can be sized much smaller than cascode output transistors 412 and 414. As a result, the gate capacitance on nodes 416 and 418 can be kept relatively small, thereby reducing the dynamic power consumption of the CMOS drivers.

Figure 5:
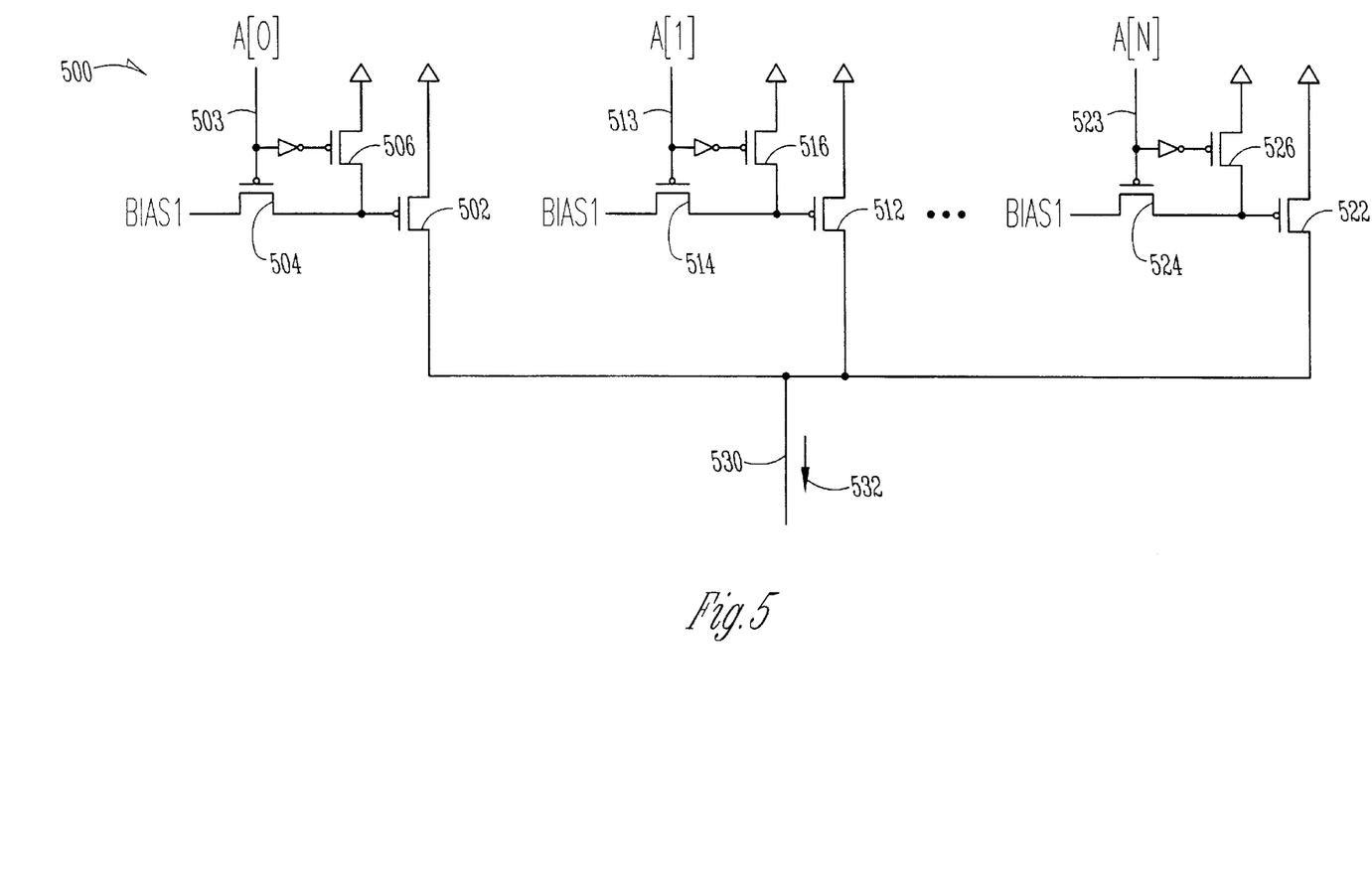
FIG. 5 shows a variable current source.

FIG. 5 shows a variable current source suitable for use as variable current source 402 (FIG. 4). Current source 500 includes a plurality of selectable current source circuits. For example, one selectable current source circuit includes current source transistor 502 and select transistors 504 and 506. Likewise, another selectable current source circuit includes current source transistor 512 and select transistors 514 and 516. Furthermore, another selectable current source circuit includes current source transistor 522 and select transistors 524 and 526. Current source 500 is shown having three selectable current source circuits, but any number of selectable current source circuits can be included without departing from the scope of the present invention.

In operation, a current source transistor is selected by varying the signals controlling the select transistors connected thereto. For example, current source transistor 502 has a gate coupled to a bias voltage "BIAS1" through select transistor 504 and coupled to a reference potential through select transistor 506. When control signal A0 is asserted, select transistor 504 conducts and select transistor 506 does not. As a result, current source transistor 502 has the bias voltage imposed from gate to source thereby providing a current that contributes to current 532 on node 530. When control signal A0 is de-asserted, select transistor 504 is off and select transistor 506 is on, thereby coupling the gate of current source transistor 502 to the reference potential and turning current source transistor 502 off. Control signals A[0 . . . N] correspond to the "CURRENT CONTROL" in FIG. 4, which in turn corresponds to control data on node 121 (FIGS. 1 and 2).

Any number of current source transistors can be on, and any number of current source transistors can be off, based on the values of the control signals shown in FIG. 5. In embodiments represented by FIG. 5, each current source transistor sources substantially the same current when the bias voltage is applied to the gate. In other embodiments, different bias voltages are provided to the different current source transistors, thereby providing a different weight to each selectable current source circuit. In still other embodiments, each current source transistor is a different size, thereby providing a different amount of current from the same bias voltage. For example, each current source transistor can be sized in a binary fashion such that a binary control word can be applied to variable current source 500 to provide a greater range of current values.

Figure 6:
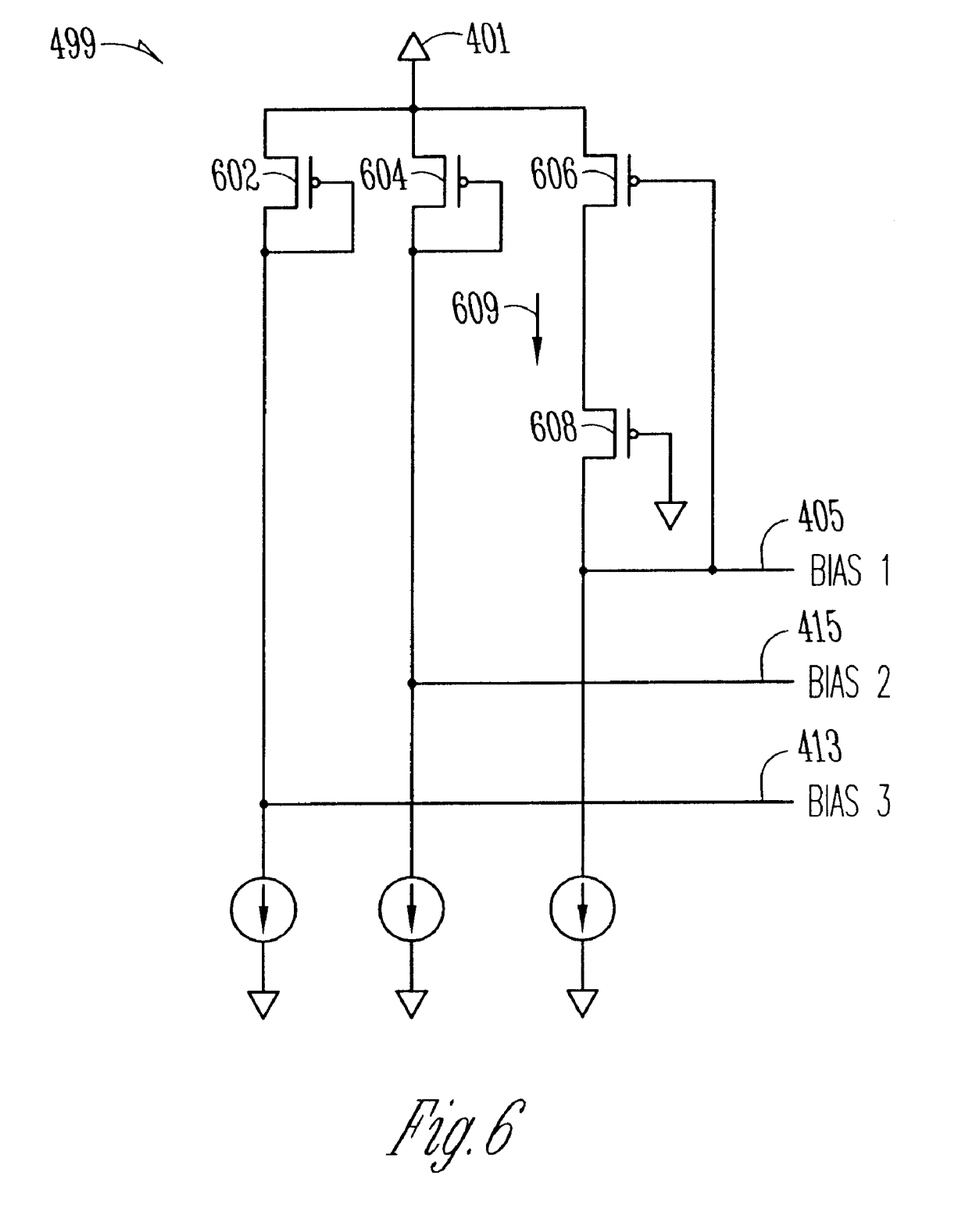
FIG. 6 shows a wide swing bias circuit.

FIG. 6 shows a wide-swing bias circuit. Wide-swing bias circuit 600 includes transistors 602, 604, 606, and 608. Transistors 602 and 604 are diode-connected. The term "diode-connected," as used herein, refers to a transistor that has a gate and a drain coupled together, as do transistors 602 and 604. Each of transistors 602 and 604 are in series with a current source, and a bias voltage is generated as the voltage drops from the voltage on power supply node 401 across the diode-connected transistor. The voltage drop across transistor 602 is used to generate BIAS3 on node 413, and the voltage drop across transistor 604 is used to generate BIAS2 on node 415.

Transistor 606 is diode-connected "around" transistor 608. The term "diode-connected around," as used herein, describes a diode-connected transistor with another transistor coupled source to drain between the diode-connected transistor's drain and gate. The combination of transistors 606 and 608 are in series with a current source, and the bias voltage BIAS1 on node 405 is generated by the voltage drop across transistors 606 and 608.

The gate of transistor 608 has a fixed voltage applied thereto. In embodiments represented by FIG. 6, the gate of transistor 608 is at ground potential. Current 609 in wide-swing bias circuit 600 flows through bias transistor 606 in series with transistor 608 having a gate at ground potential. Likewise, the tail current path in driver 400 includes one or more current source transistors in series with an input transistor having a gate at ground potential when one of the differential input transistors 404 or 406 is on, because the gate of the input transistor is substantially at ground potential because it is driven by a CMOS driver. This configuration approximately matches the direct current (DC) operating points between driver 400 (FIG. 4) and bias circuit 600 so as to achieve a current match between the bias and the driver.

Figure 7:
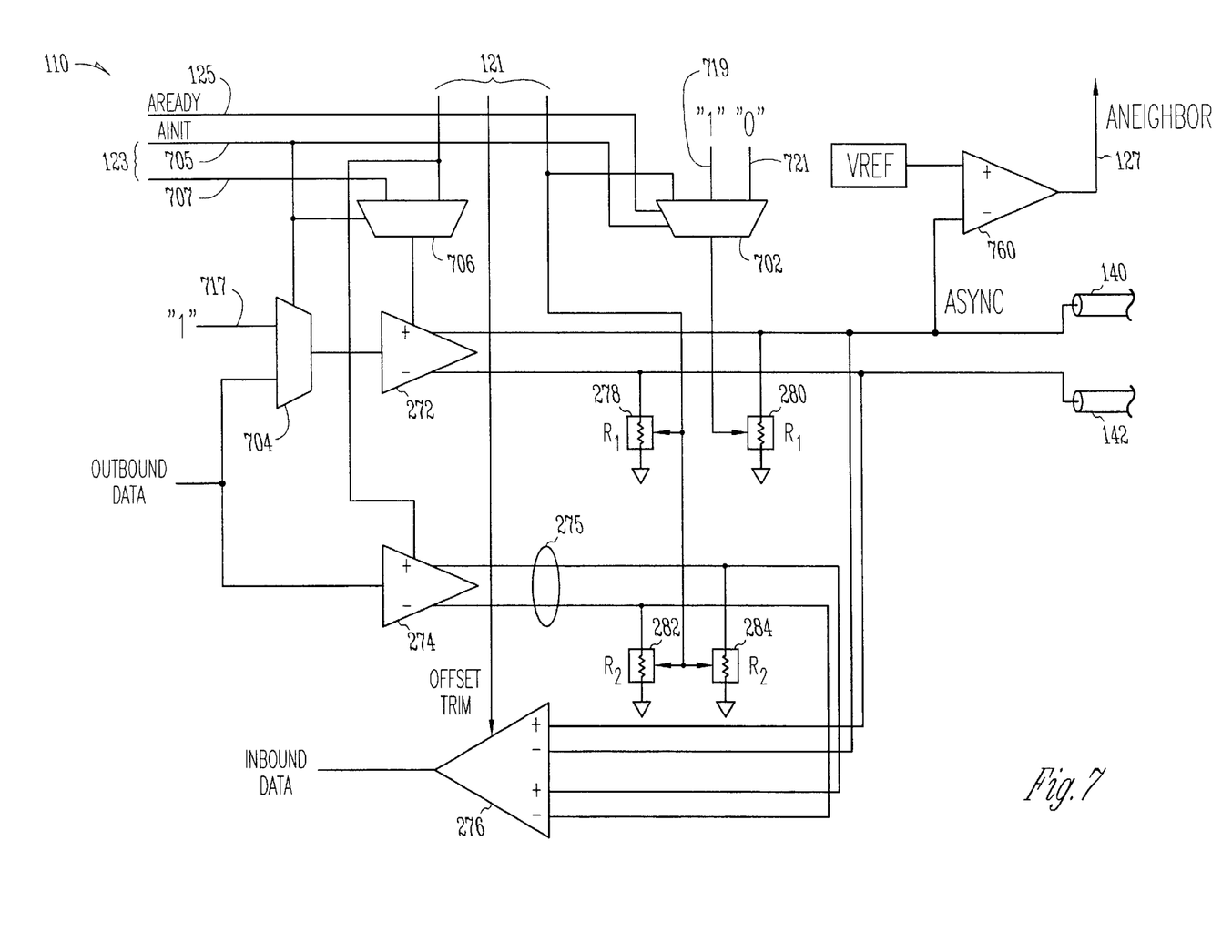
FIG. 7 shows a combination data and synchronization circuit.

FIG. 7 shows a combination data and synchronization transceiver and associated control circuitry. Combination data and synchronization transceiver 110 includes current mode drivers 272 and 274, receiver 276, and variable resistors 278, 280, 282, and 284. These devices are also shown in FIG. 2, and described with reference thereto. Combination data and synchronization transceiver 110 also includes synchronization receiver 760 and multiplexors 702, 704, and 706.

Combination data and synchronization transceiver 110 operates in one of two modes, depending on the control information provided on node 123 by synchronization control circuit 122 (FIG. 1). Node 123 includes nodes 705 and 707. Node 705 carries an "AINIT" signal, and node 707 carries current source control information for current mode driver 272. The AINIT signal on node 705 controls multiplexors 702, 704, and 706. The two modes are "synchronization mode" and "data transceiver mode." The data transceiver mode is described first, in part because it is substantially similar to the operation of data transceiver 206 as described above with reference to FIG. 2.

The mode of combination data and synchronization transceiver is set by the state of the AINIT signal on node 705. Data transceiver mode is selected when the AINIT signal is asserted as a logical zero. In this mode, multiplexor 704 takes its input from the OUTBOUND DATA node, multiplexor 702 takes its input from node 121, and multiplexor 706 takes its input from node 121. When multiplexors 702, 704, and 706 are steered in this fashion, the operation of combination data and synchronization transceiver 110 mirrors that of data transceiver 206 (FIG. 2). When in data transceiver mode, transceiver 110 operates to simultaneously send and receive data on a simultaneous bidirectional bus by switching currents between conductors 140 and 142.

The synchronization mode is entered when the AINIT signal is asserted as a logical one. When embodiments represented by FIG. 7 are in this mode, multiplexor 704 takes its input from a hard-wired logical "1" signal on node 717, multiplexor 706 takes its input from node 707, and multiplexor 702 takes its input from either a hard-wired logical "1" on node 719 or a hard-wired logical "0" on node 721 as a function of the AREADY signal on node 125. In other embodiments, multiplexors 704 and 702 do not receive hardwired signals, but rather receive signals from other sources, such as synchronization control circuit 122 (FIG. 1).

During synchronization mode, the synchronization control circuit steers a logical "1" into driver 272, thereby causing current to be driven on conductor 140, and not on conductor 142. For as long as transceiver 110 is in synchronization mode, conductor 140 is utilized, and conductor 142 is not. The synchronization control circuit also sets the output current of driver 272 to a relatively small value. Prior to receiving an ADONE indication from the initialization circuit, the synchronization control circuit holds AREADY de-asserted, thereby steering a logical "1" to resistor 280, causing resistor 280 to have a relatively small resistance value. In other embodiments, the synchronization control circuit provides a signal other than a logical "1" to resistor 280 to select a particular resistance value. The absolute current value and resistance values are not important.

When in synchronization mode, and prior to AREADY being asserted high, resistor 280 pulls the voltage on conductor 140 down by presenting the relatively low resistance to conductor 140. The output current provided by driver 272 is not great enough to cause the voltage on conductor 140 to surpass the reference voltage, VREF. When synchronization control circuit 122 (FIG. 1) asserts AREADY high, a logical "0" is presented to variable resistor 280 causing it to present a high impedance to conductor 140. The synchronization mode output current of driver 272 is set such that the voltage on conductor 140 does not satisfy the threshold of synchronization receiver 760 until both resistor 280 and the resistor on the other end of conductor 140 present a high impedance to conductor 140.

When both termination resistors on both ends of conductor 140 present a high impedance, the signal on conductor 140 satisfies the threshold, and the output of synchronization receiver 760 changes state. This asserts the ANEIGHBOR signal on node 127, signifying that integrated circuits on both sides of the simultaneous bidirectional bus are ready to communicate. Synchronization control circuit 122 responds to the asserted ANEIGHBOR signal by transitioning combination data and synchronization transceiver 110 from synchronization mode to data transceiver mode.

When one of AREADY or BREADY is asserted by the respective agent, the input node of synchronization receiver 760 will experience various voltage values as the signal reflects back and forth on conductor 140, but the input voltage value will not be high enough to satisfy the threshold voltage (VREF) of either synchronization receiver 760 or the synchronization receiver on the other end of conductor 140. Referring now back to FIG. 1, only when both AREADY and BREADY are asserted will the threshold voltage of the synchronization receiver be satisfied, causing the ANEIGHBOR and BNEIGHBOR signals to be asserted. When the ANEIGHBOR signal is asserted, the "A" agent has an indication that both of the agents on the simultaneous bidirectional bus are ready to communicate, and when the BNEIGHBOR signal is asserted, the "B" agent has an indication that both of the agents on the simultaneous bidirectional bus are ready to communicate.

Figure 8:
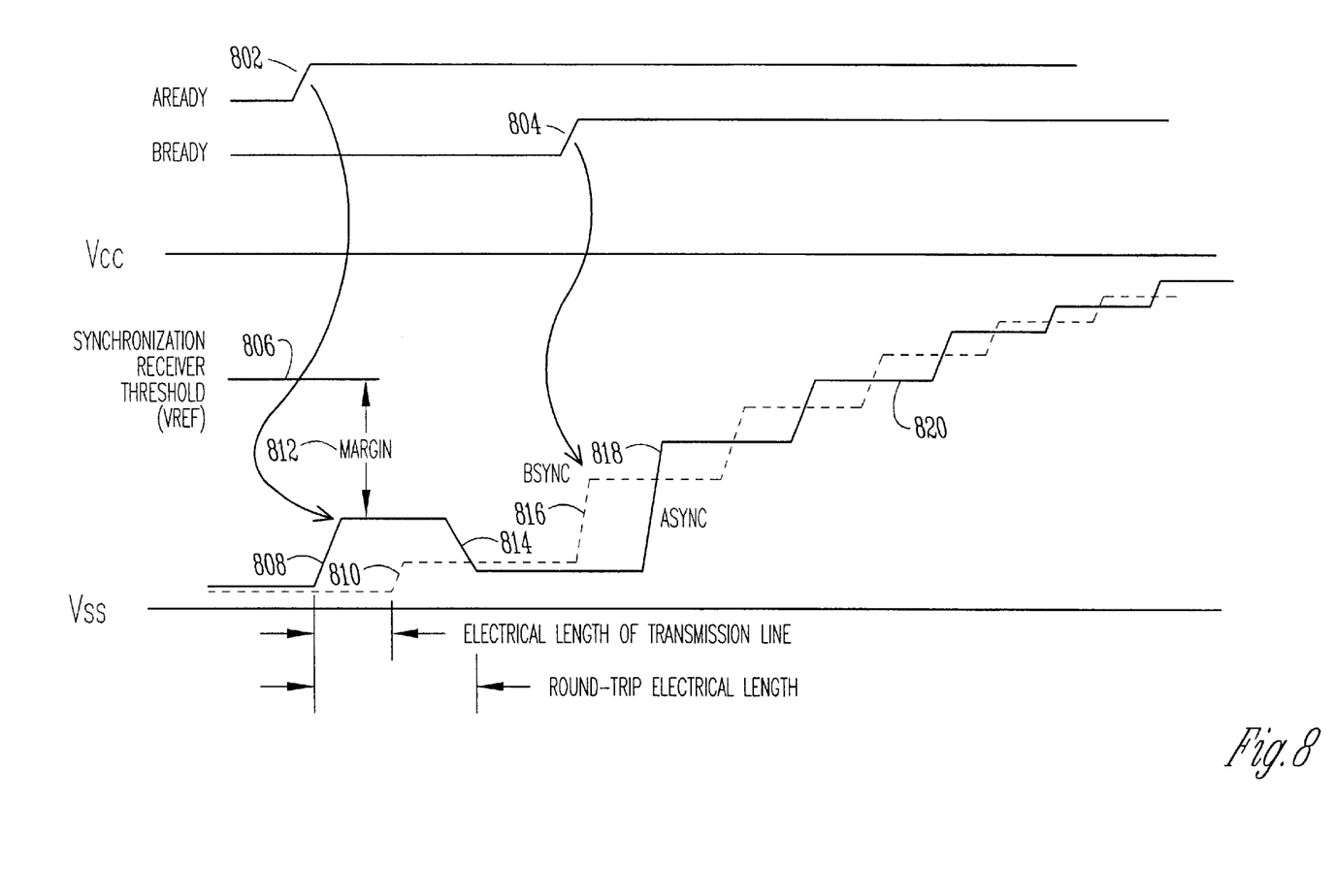
FIG. 8 shows a timing diagram of the operation of the combination data and synchronization circuit.

FIG. 8 shows a timing diagram of the operation of the combination data and synchronization circuit of FIG. 7. The waveforms of FIG. 8 show the voltage values on either end of the conductor used for synchronization when AREADY is asserted prior to BREADY being asserted. AREADY is asserted high at 802. This corresponds to the impedance of resistor 280 within data transceiver 110 transitioning from a relatively low impedance to a relatively high impedance. ASYNC, which represents the voltage at the input to synchronization receiver 760, is shown increasing in voltage at 808 as a result of AREADY being asserted at 802. After a time equivalent to the electrical length of the transmission line, BSYNC (which represents the voltage at the input to the synchronization receiver of the B agent) rises in voltage at 810. BSYNC does not rise as high as ASYNC because until BREADY is asserted, the termination at the B agent presents a relatively small impedance. After a time equal to one round-trip electrical length of the transmission line, ASYNC reduces in voltage as shown by 814. Prior to the assertion of BREADY, small reflections (not shown) travel back and forth on the transmission line (conductor 140).

Receiver threshold 806 is the voltage level necessary for either ASYNC or BSYNC to cause the synchronization receiver in either agent to assert the appropriate NEIGHBOR signal. As can be seen in FIG. 8, the initial voltage step launched into the transmission line falls short of threshold 806 by margin 812. Setting the threshold of the receivers higher than the initial voltage step into the line prevents the NEIGHBOR signal from false assertions. Varying impedance values and output current values can be used while still maintaining adequate margin 812 so that neither ANEIGHBOR nor BNEIGHBOR is falsely asserted.

When BREADY is asserted at 804, BSYNC increases in voltage correspondingly at 816. With both AREADY and BREADY asserted, both ASYNC and BSYNC eventually increase in voltage enough to surpass receiver threshold 806, causing ANEIGHBOR and BNEIGHBOR to assert within the respective agents on the simultaneous bidirectional bus. Because of the impedance mismatch between conductor 140 and the terminations at either end, reflections continue to bounce back and forth across conductor 140 until the voltage settles out close to Vcc. The reflections are shown at 820.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A bidirectional port circuit comprising:
   a current mode output driver having a variable current source;
   a synchronization control circuit coupled to the current mode output driver to control the variable current source during an initialization sequence; and
   an initialization circuit coupled to the current mode output driver to control the variable current source other than during the initialization sequence.

2. The bidirectional port circuit of claim 1 further comprising:
   a variable termination resistor coupled to an output node of the current mode output driver to present a termination resistance value.

3. The bidirectional port circuit of claim 2 wherein:
   the synchronization control circuit is coupled to the variable termination resistor to control the termination resistance value during the initialization sequence; and
   the initialization circuit is coupled to the variable termination resistor to control the termination resistance value other than during the initialization sequence.

4. The bidirectional port circuit of claim 2 wherein the synchronization control circuit is operable to control both the variable current source and the variable termination resistor during the initialization sequence.

5. The bidirectional port circuit of claim 4 further including a synchronization receiver coupled to the output node to detect changes made by the synchronization control circuit.

6. The bidirectional port circuit of claim 2 wherein the initialization circuit is operable to control both the variable current source and the variable termination resistor other than during the initialization sequence.

7. The bidirectional port circuit of claim 2 wherein the synchronization control circuit is operable to increase the termination resistance value in response to the initialization circuit.

8. The bidirectional port circuit of claim 1 further including a data transceiver responsive to the initialization circuit.

9. The bidirectional port circuit of claim 1 wherein:
   the current mode output driver is part of a first data transceiver;
   the bidirectional port circuit comprises a plurality of data transceivers of which the first data transceiver is one, the plurality of data transceivers being arranged from a most significant bit to a least significant bit; and
   the first data transceiver is the most significant bit.

10. The bidirectional port circuit of claim 1 wherein:
    the current mode output driver is part of a first data transceiver;
    the bidirectional port circuit comprises a plurality of data transceivers of which the first data transceiver is one, the plurality of data transceivers being arranged from a most significant bit to a least significant bit; and
    the first data transceiver is the least significant bit.

11. An integrated circuit having a bidirectional port comprising:
    a first data transceiver capable of being initialized;
    an initialization circuit to initialize the first data transceiver; and
    a second data transceiver operable to present a reduced output current when the first data transceiver is being initialized, and to present an increased output current thereafter.

12. The integrated circuit of claim 11 wherein the second data transceiver comprises:
    an output node;
    a variable current source coupled to the output node; and
    a variable termination resistor coupled to the output node.

13. The integrated circuit of claim 12 further comprising a synchronization control circuit coupled to the variable current source and the variable termination resistor.

14. The integrated circuit of claim 13 further comprising:
    a multiplexor coupled to an input node of the second data transceiver, the multiplexor configured to drive the second data transceiver with a signal from the synchronization control circuit or a data signal from within the integrated circuit.

15. The integrated circuit of claim 11 wherein:
    the first data transceiver includes a variable termination resistor; and
    the initialization circuit is operable to initialize the variable termination resistor of the first data transceiver.

16. The integrated circuit of claim 11 wherein the bidirectional port includes a plurality of data transceivers other than the first and second data transceivers.

17. The integrated circuit of claim 16 wherein the first, second, and plurality of data transceivers form a bus arranged from most significant bit to least significant bit, and the second data transceiver is the most significant bit.

18. The integrated circuit of claim 16 wherein the first, second, and plurality of data transceivers form a bus arranged from most significant bit to least significant bit, and the second data transceiver is the least significant bit.

19. An integrated circuit comprising:

a synchronization control circuit;

an initializable data driver having an output node to drive a first data node external to the integrated circuit;

a combination data and synchronization driver responsive to the synchronization control circuit to present a variable output current and termination resistance to a second data node external to the integrated circuit as a function of whether the data driver has been initialized; and a synchronization receiver having an input node coupled to the second data node external to the integrated circuit, and having an output node coupled to the synchronization control circuit.

20. The integrated circuit of claim 19 wherein the data driver includes a variable termination resistance coupled to the first data node external to the integrated circuit.

21. The integrated circuit of claim 20 further comprising an initialization circuit to initialize the variable termination resistance of the data driver.

22. The integrated circuit of claim 19 wherein the integrated circuit is a circuit type from the group comprising: a processor, a processor peripheral, a memory, and a memory controller.

23. The integrated circuit of claim 19 wherein:

the data driver is part of a first data transceiver, the first data transceiver further comprising a receiver having an input node coupled to the first data node external to the integrated circuit; and the combination output and synchronization driver is part of a second data transceiver, the second data transceiver further comprising a second receiver having an input node coupled to the second data node external to the integrated circuit.

24. An electronic system comprising:

a first integrated circuit including a first simultaneous bidirectional port comprising a first data driver, a first data receiver, and a first combination data and synchronization driver having a variable output current and a variable output resistance, the first integrated circuit further including a first synchronization control circuit operable to set the variable output current and the variable output resistance of the first combination data and synchronization driver; and a second integrated circuit including a second simultaneous bidirectional port comprising a second data driver, a second data receiver, and a second combination data and synchronization driver having a variable output current and a variable output resistance, the second integrated circuit further including a second synchronization control circuit operable to set the variable output current and the variable output resistance of the second combination data and synchronization driver;

wherein output nodes of the first and second data drivers are coupled in common with input nodes of the first and second data receivers, and output nodes of the first and second combination data and synchronization drivers are coupled in common.

25. The electronic system of claim 24 wherein the first synchronization control circuit is operable to set the variable output current and the variable output resistance of the first combination data and synchronization driver during an initialization state.

26. The electronic system of claim 25 wherein the first integrated circuit further comprises a first initialization circuit, and wherein the first initialization circuit is operable to set a variable output current and a variable output resistance of the first data driver during the initialization state.

27. The electronic system of claim 26 wherein the first initialization circuit is operable to set the variable output current and the variable output resistance of the first combination data and synchronization driver after the initialization state.

* * * * *